(12) United States Patent
Chiueh et al.

(10) Patent No.: US 7,246,298 B2
(45) Date of Patent: Jul. 17, 2007

(54) UNIFIED VITERBI/TURBO DECODER FOR MOBILE COMMUNICATION SYSTEMS

(75) Inventors: Tzi-Dar Chiueh, Taipei (TW); Sung-Chiao Li, Yonghe (TW); Chan-Shih Lin, Taipei (TW)

(73) Assignee: VIA Technologies, Inc., Taipei (TW)

( * ) Notice: Subject to any disclaimer, the term of this patent is extended or adjusted under 35 U.S.C. 154(b) by 385 days.

(21) Appl. No.: 10/990,929

(22) Filed: Nov. 17, 2004

(65) Prior Publication Data

US 2005/0149838 A1   Jul. 7, 2005

Related U.S. Application Data

(60) Provisional application No. 60/523,981, filed on Nov. 24, 2003.

(51) Int. Cl.
*H03M 13/00* (2006.01)
*H03M 13/03* (2006.01)

(52) U.S. Cl. .............. 714/755; 714/794; 714/795; 714/796; 375/262; 375/341

(58) Field of Classification Search .............. 714/755, 714/794, 795, 796; 375/341, 262
See application file for complete search history.

(56) References Cited

U.S. PATENT DOCUMENTS 5,272,706 A * 12/1993 Park ........................... 714/795
6,738,941 B1 * 5/2004 Todoroki .................. 714/755
6,823,489 B2 * 11/2004 Wittig et al. .............. 714/792
2003/0018942 A1   1/2003 Seo ........................... 714/786
2003/0028845 A1   2/2003 Plante et al. .............. 714/796
2003/0101403 A1 * 5/2003 Jeon et al. .................. 714/755

FOREIGN PATENT DOCUMENTS

JP    2002217748 A2   8/2002
KR    10-2002-0067769   8/2002

* cited by examiner

*Primary Examiner*—Guy Lamarre
*Assistant Examiner*—Esaw T. Abraham
(74) *Attorney, Agent, or Firm*—Thomas, Kayden, Horstemeyer & Risley

(57) ABSTRACT

A Viterbi/Turbo unified decoder supports both voice and data streams due to the ability of performing Viterbi (convolutional) decoding and Turbo decoding. The Viterbi/Turbo unified decoder of an embodiment reduces the hardware cost by computing path metrics for both Viterbi and Turbo decoding using a single control circuit. The control circuit comprises a plurality of processors and memory banks, and the routing rule for the processors to read/write the path metric information from/to the memory banks are fixed for both Viterbi and Turbo coded inputs.

12 Claims, 15 Drawing Sheets

| State index | Bank index | Block index | Path metric value | ACSP index |
|---|---|---|---|---|
| 00000000 | 000 | 0 | $P_0$ | 00 |
| 00000001 | 000 | 0 | $P_1$ | 00 |
| 00000010 | 000 | 0 | $P_2$ | 00 |
| 00000011 | 000 | 0 | $P_3$ | 00 |
| ...... | ...... | ...... | ...... | ...... |
| 11111110 | 111 | 0 | $P_{254}$ | 11 |
| 11111111 | 111 | 0 | $P_{255}$ | 11 |

FIG. 10b

UNIFIED VITERBI/TURBO DECODER FOR MOBILE COMMUNICATION SYSTEMS

CROSS REFERENCE APPLICATION

This application claims priority from U.S. Provisional Patent Application No. 60/523,981 filed on Nov. 24, 2003.

BACKGROUND

The present invention relates to a unified Viterbi/Turbo decoder in wireless communication systems, and in particular, to a system for receiving and decoding voice and data streams adaptively.

Error control coding techniques involves the use of a channel encoder in the transmitter and a decoder in the receiver. The channel encoder accepts message bits and adds redundancy according to a prescribed rule, thereby producing encoded data at a higher bit rate. The channel decoder exploits the redundancy to decide which message bits were actually transmitted. The purpose of error control coding is to minimize the effect of channel noise. The error control codes are generally classified into block codes and convolutional codes. Convolutional codes are preferred for wireless voice communication systems in which the retransmission of data and its associated delay is intolerable. Block codes are capable of delivering higher throughput and are preferred for the transmission of data where latency is less of a concern.

The Viterbi algorithm is a sequential trellis search algorithm for performing maximum-likelihood (ML) sequence detection, and it is an optimum decoding algorithm for convolutional codes. A published book written by S. B. Wicker, named "Error Control System for Digital Communication and Storage, Pretice Hall, 1995." disclosed a Viterbi decoder for use in mobile communication systems.

FIG. 1 shows a flowchart of a decoding algorithm used in a practical Viterbi decoder. The decoding procedures include quantization, branch metric computation, path metric update, survivor path recording, and output decision generation. The received signals are first recovered by sampling, and then converted to digital signals. The boundaries of frames and code symbols in the digital signals are detected for block synchronization. After branch metric computation, the partial path metrics is updated using the new branch metric, and the surviving path at each node is tagged. Finally, the decoded output sequence based on the survivor path information can be generated.

FIG. 2 shows a generic Viterbi decoder 20. The Viterbi decoder 20 includes a branch metric calculating (BMC) unit 202, whose output is presented to an Add Compare Select (ACS) unit 204. A state controller 206 provides inputs to the BMC unit 202, the ACS unit 204 and a path metric memory 208. The path metric memory 208 acts as a double buffer and interchanges information with the ACS unit 204. A borrow output 205 of the ACS unit 204 is presented to a trace-back memory and controller 210, whose output is the received information signal 211.

Turbo codes, also known as parallel concatenated codes, are a class of codes whose performance is very close to the Shannon capacity limit. Turbo encoders are implemented by connecting convolutional encoders either in parallel or series to produce concatenated outputs. Bit sequences passing from one encoder to another are permuted by a pseudo-random interleaver, and thus low-weight code words produced by a single encoder are transformed into high-weight code words. Third generation (3G) mobile wireless standards, such as Code Division Multiple Access (CDMA) 2000 and Universal Mobile Telecommunication Service (UMTS) require Turbo encoding for data streams. UK patent application number GB2352943A and "Turbo codes, principles and application, Kluwer Academic Publishers, 2000." Written by B. Vucetic and J. Yuan disclosed embodiments of the Turbo decoder with the Maximum a Posteriori probability (MAP) algorithm and Soft Output Viterbi Algorithm (SOVA).

FIG. 3 shows an iterative Turbo decoder based on the MAP algorithm. A received symbol in a Turbo decoder consists of systematic data, representing the actual data being transmitted, and parity data, which represents the coded form of the data being transmitted. A first input $r_0$, being the parity data of the received symbol, is presented to a first MAP decoder 302 and a second MAP decoder 306 via an interleaver 304. A second input $r_1$, being the systematic data of the received symbol, is presented to the first MAP decoder 302. A recursive input 311 from a deinterleaver 310 is also presented to the first MAP decoder 302. The output 303 of the first MAP decoder 302 is then provided to an interleaver 308, whose output is provided to the second MAP decoder 306. The second MAP decoder 306 also receives an input from a third input $r_2$ and generates two outputs. A first output 307a of the second MAP decoder 306 is provided to the deinterleaver 310, whereas the second output 307b is provided to another deinterleaver 312. The output of the deinterleaver 312 is provided to a slicer 314, which applies a threshold to a soft output to convert it to a hard output, being a received information signal 315.

Third Generation (3G) communication systems typically require both convolutional coding, for example, Viterbi coding, and Turbo coding for voice and data signals respectively. It is because the transmission of voice and data provides conflicting requirements for transmission rate versus latency and propagation delay. The current mode of addressing these problems is to provide separate encoding systems: Turbo coding for high data-rate data streams and convolutional coding for voice or low data-rate data streams. The receivers of such systems thus require two independent decoders, resulting in a multiplicity of hardware platforms and increasing cost.

SUMMARY

A unified Viterbi/Turbo decoder is provided which is capable of performing either convolutional decoding or Turbo decoding according to the input coding type. In an embodiment, the decoder comprises a Branch Metric Calculation (BMC) unit, a control circuit, a trace-back unit, an interleaver/de-interleaver, and a Turbo buffer. The BMC unit receives either a Viterbi or Turbo symbols and determines a branch metric associated with each node of the code word. The decoder is configurable to adapt the input, and the control circuit is a common component for the two coding types which fully utilize the memory and processor capacity. The control circuit computes partial path metrics at each node with its processors according to the corresponding branch metric and the partial path metrics at a preceding node stored in a first memory block. The control circuit then stores the computed partial path metrics in a second memory block. For processing the next node, the control circuit reads from the second memory block then stores in the first memory block after computation, and so on. The two memory blocks interchange path metric information with the processors. The order and address for reading and writing the partial path metrics from/to the memory blocks follow a fixed routing rule, which allows the partial path metrics to be processed in parallel to fully utilize the processing capacity. The control circuit then performs either selection or Maximum a Posteriori probability (MAP) calculation depending on the input coding type to identify a surviving path at each node.

The trace-back unit receives the output of the control circuit while performing Viterbi decoding, and it tracks the surviving paths designated by the control circuit. The interleaver/de-interleaver receives the output of the control circuit while performing Turbo decoding, and permutes or recovers the order of its input in a deterministic manner. The Turbo buffer receives the input symbols and the output of the interleaver/de-interleaver, and provides storage for the BMC unit and the interleaver/de-interleaver.

In an embodiment, the control circuit comprises an Add Compare Select Processor (ACSP) array having J ACSPs ($J=2^m$, m belongs to an integer, and m+1 must be less than the constraint length of the encoder, n+1), a path metric calculation unit having the first and second memory blocks, a fixed routing circuit, and a selection and MAP calculation unit. The ACSP array computes the partial path metrics at each node according to the corresponding branch metric. Each ACSP comprises two Add Compare Select units (ACSU) processing the partial path metrics in parallel. The path metric calculation unit stores the partial path metrics associated with a current node and a preceding node in the two memory block. Each memory block comprises I memory banks, wherein $I=2^{m+1}$. The fixed routing circuit establishes fixed connections between each ACSP and four memory banks, two from each memory block, according to the fixed routing rule. The selection and MAP calculation unit performs either selection or MAP calculation to identify the surviving path at each node. The selection and MAP calculation unit computes a Log-Likelihood Ratio (LLR) according to the branch metrics obtained from the BMC unit and the path metrics obtained from the path metric calculation mean for the Turbo code word.

BRIEF DESCRIPTION OF THE DRAWINGS

An embodiment of the present invention can be more fully understood by reading the subsequent detailed description in conjunction with the examples and references made to the accompanying drawings, wherein:

FIG. 7b illustrates a detail diagram for FIG. 7a.

FIG. 10b illustrates the data structure corresponding to the path metric memory bank for 256 states Viterbi decoding according to the third embodiment of the invention.

DETAILED DESCRIPTION

First Embodiment

Figure 1:
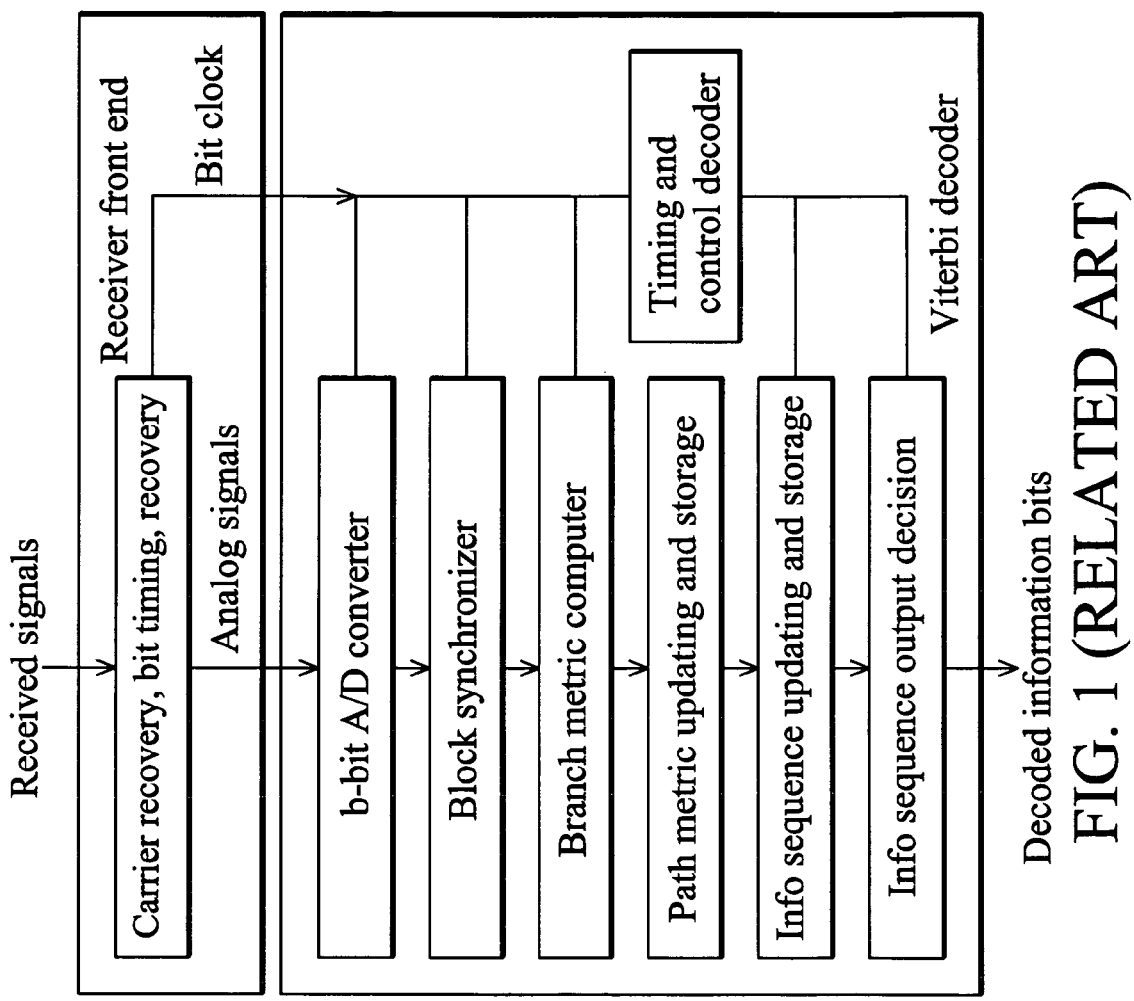
FIG. 1 illustrates a flowchart of a practical Viterbi decoder.
Figure 2:
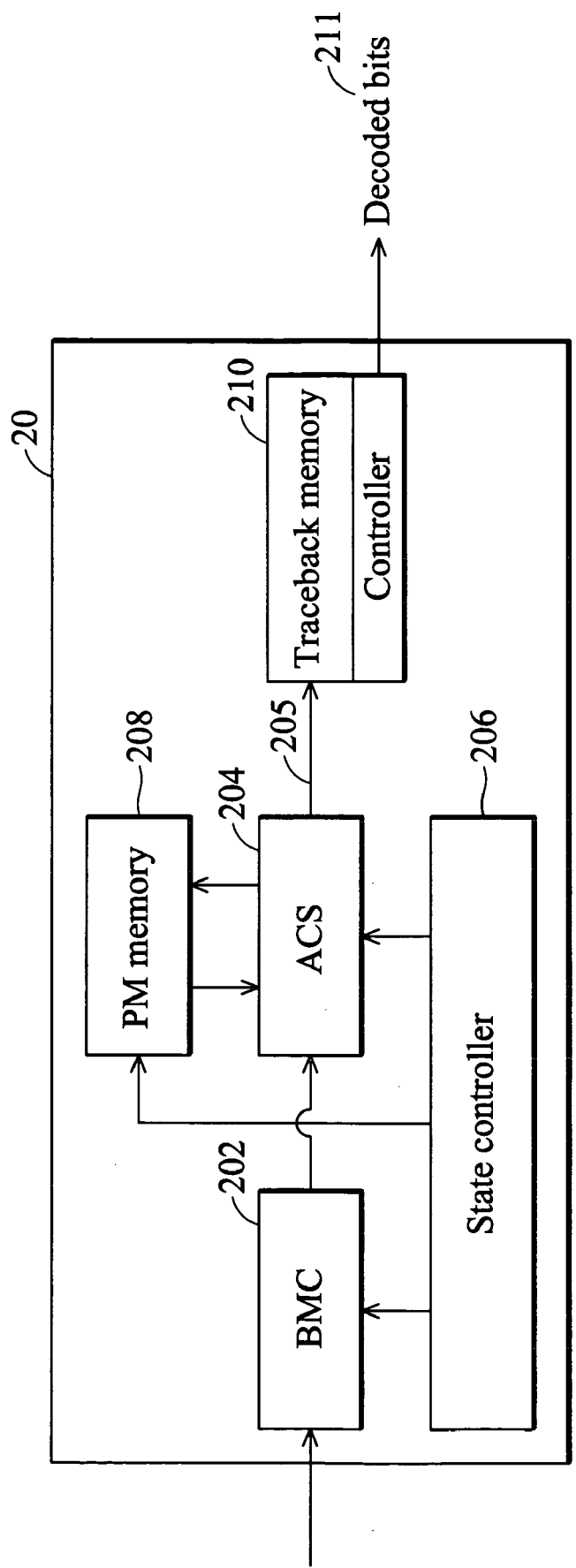
FIG. 2 illustrates a block diagram of a practical Viterbi decoder.
Figure 3:
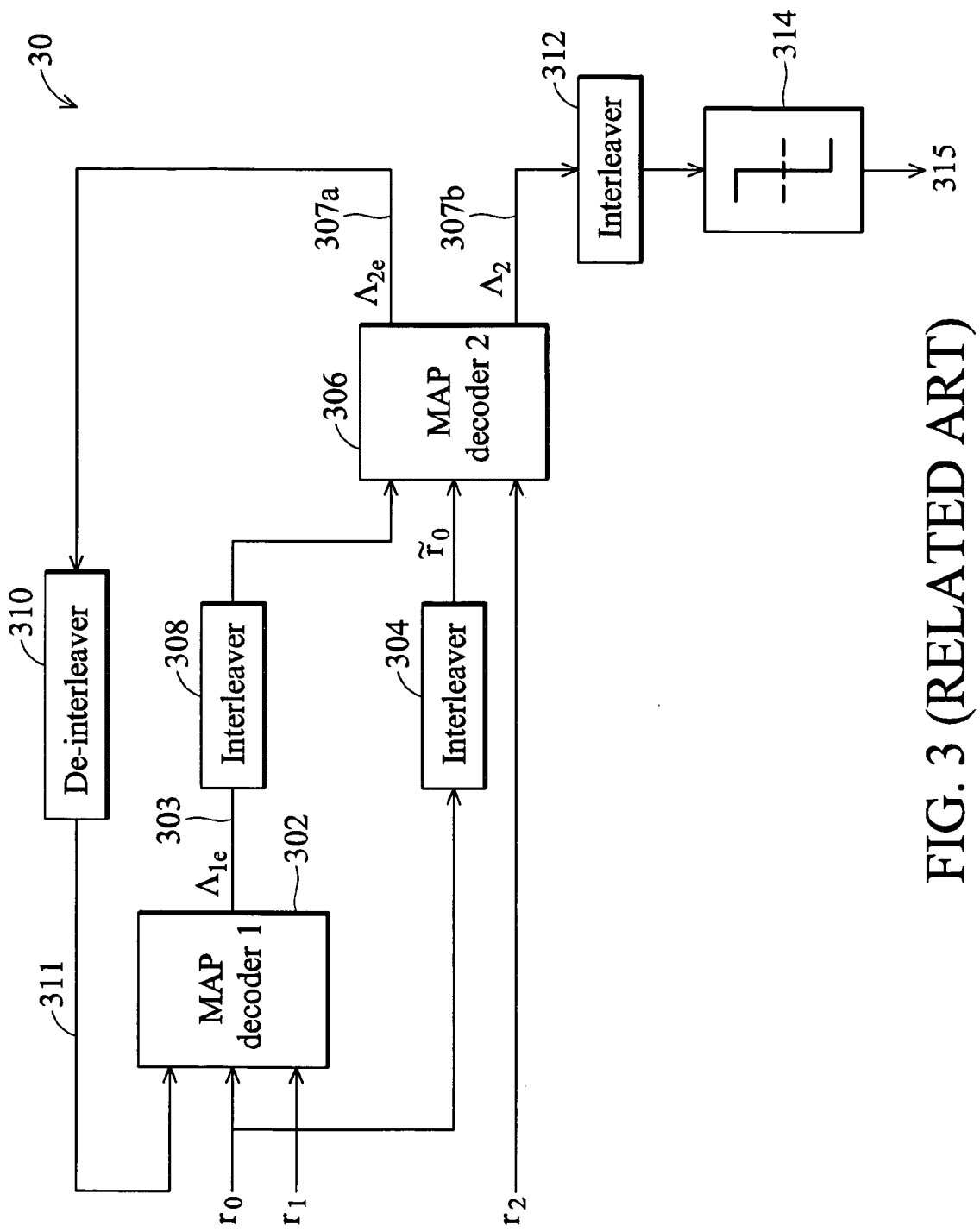
FIG. 3 illustrates a block diagram of an iterative Turbo decoder based on the MAP algorithm.
Figure 4:
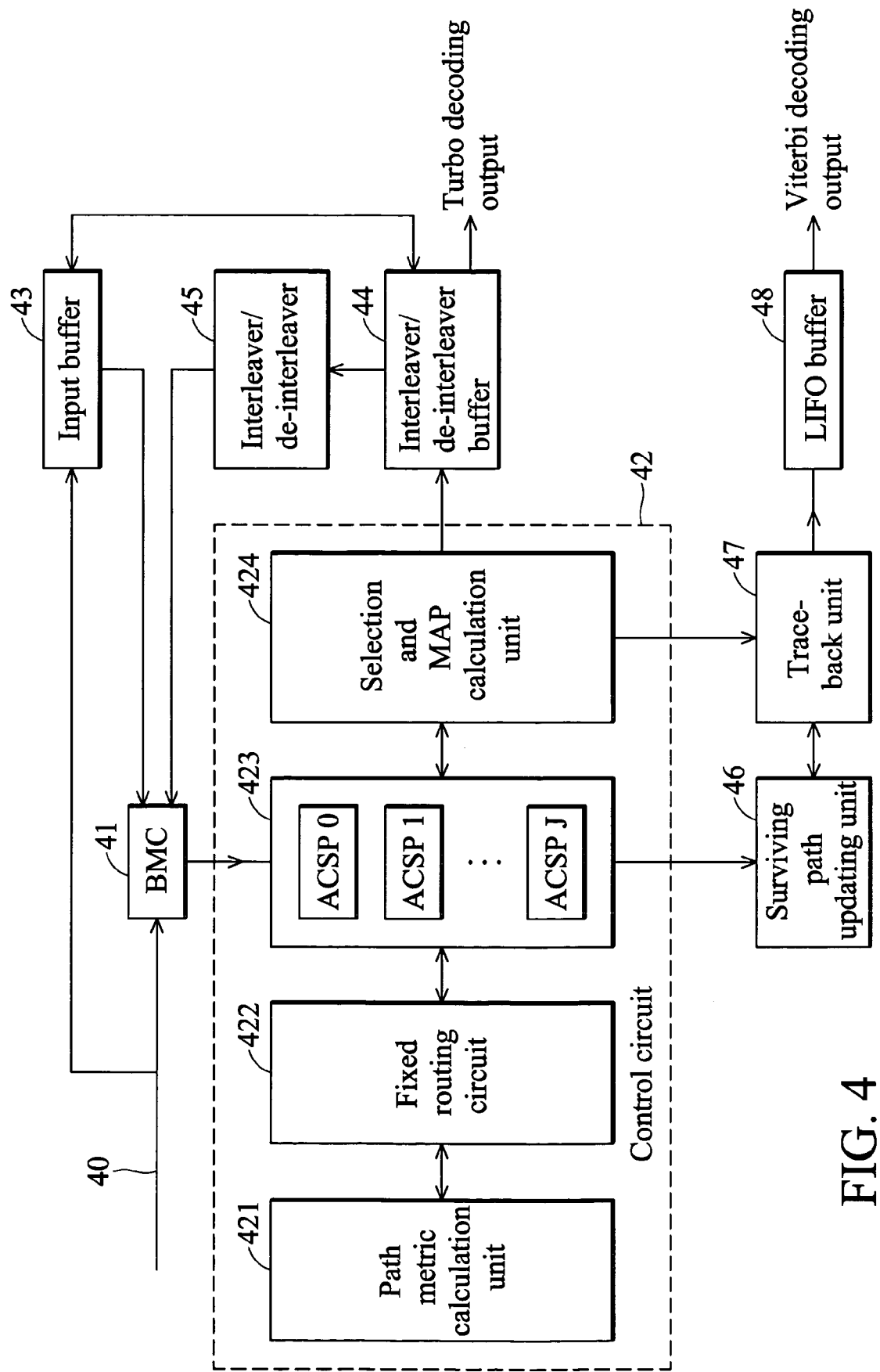
FIG. 4 illustrates a block diagram of a unified Viterbi/Turbo decoder according to the first embodiment of the invention.

FIG. 4 shows a block diagram of a unified Viterbi/Turbo decoder according to an embodiment of the invention. The unified Viterbi/Turbo decoder 4 is capable of executing either convolutional or Turbo decoding depending on the encoding method of the received data. The unified Viterbi/Turbo decoder 4 decodes w-bit noisy symbols received from a noisy input terminal 40. The unified Viterbi/Turbo decoder 4 comprises an input buffer 43, a branch metric calculating (BMC) unit 41, a control circuit 42, an interleaver/deinterleaver buffer 45, an interleaver/deinterleaver 44, a survivor path updating unit 46, a trace-back unit 47, and a last-in-first-out (LIFO) buffer 48.

As shown in FIG. 4, the control circuit 42 comprises a path metric calculation unit 421 with a path memory bank, a fixed routing circuit 422, an add-compare-select processor (ACSP) array 423, and a selection and MAP calculation unit 424. The selection and MAP calculation unit 424 comprises a selection unit for the convolutional (Viterbi) decoding and a MAP unit for calculating the Log Likelihood Ratio (LLR) of the Turbo decoding. The control circuit 42 performs the major calculations required in either Viterbi or Turbo decoding, and it is a common working area for both Viterbi and Turbo decoding. The control circuit 42 is an optimum replacement for individual computation unit of the Viterbi and Turbo decoder. The chip size of a receiver capable of decoding both Viterbi and Turbo codes can thus be reduced. Voice or low data-rate type of input is coded by Viterbi codes and high data-rate type of input is coded by Turbo codes, thus the processing paths for decoding these two input types are different. Both voice streams and data streams are providing to the BMC unit 41 after receiving, then provided to the control circuit 42. The Viterbi encoded streams are provided to the survivor path updating unit 46 and the trace-back unit 47 after data processing in the control circuit 42, whereas the Turbo encoded streams are provided to interleaver/deinterleaver 44 and buffers 43 and 45 after data processing in the control circuit 42 to perform interleaving and deinterleaving.

The survivor path updating unit 46 comprises a Survivor Path Memory (SPM) for storing surviving paths determined at each node in the trellis diagram for Viterbi decoding.

In the first embodiment, the constraint length of the convolutional encoder is 5 (n=4), thus there are 16 states ($2^n=16$) in the Viterbi decoding. The number of ACSPs in the ACSP array 423 is chosen to be $2^m$, wherein m must be less than n, and m=2 is chosen in this embodiment. Each ACSP comprises an Add Compare Select Unit (ACSU) pair, thus is capable of processing two inputs simultaneously. Consequently, an efficient design is to provide eight memory banks ($2^{m+1}=8$) to cooperate with the four ACSPs, as the four ACSPs can process eight partial path metrics simultaneously.

Figure 5:
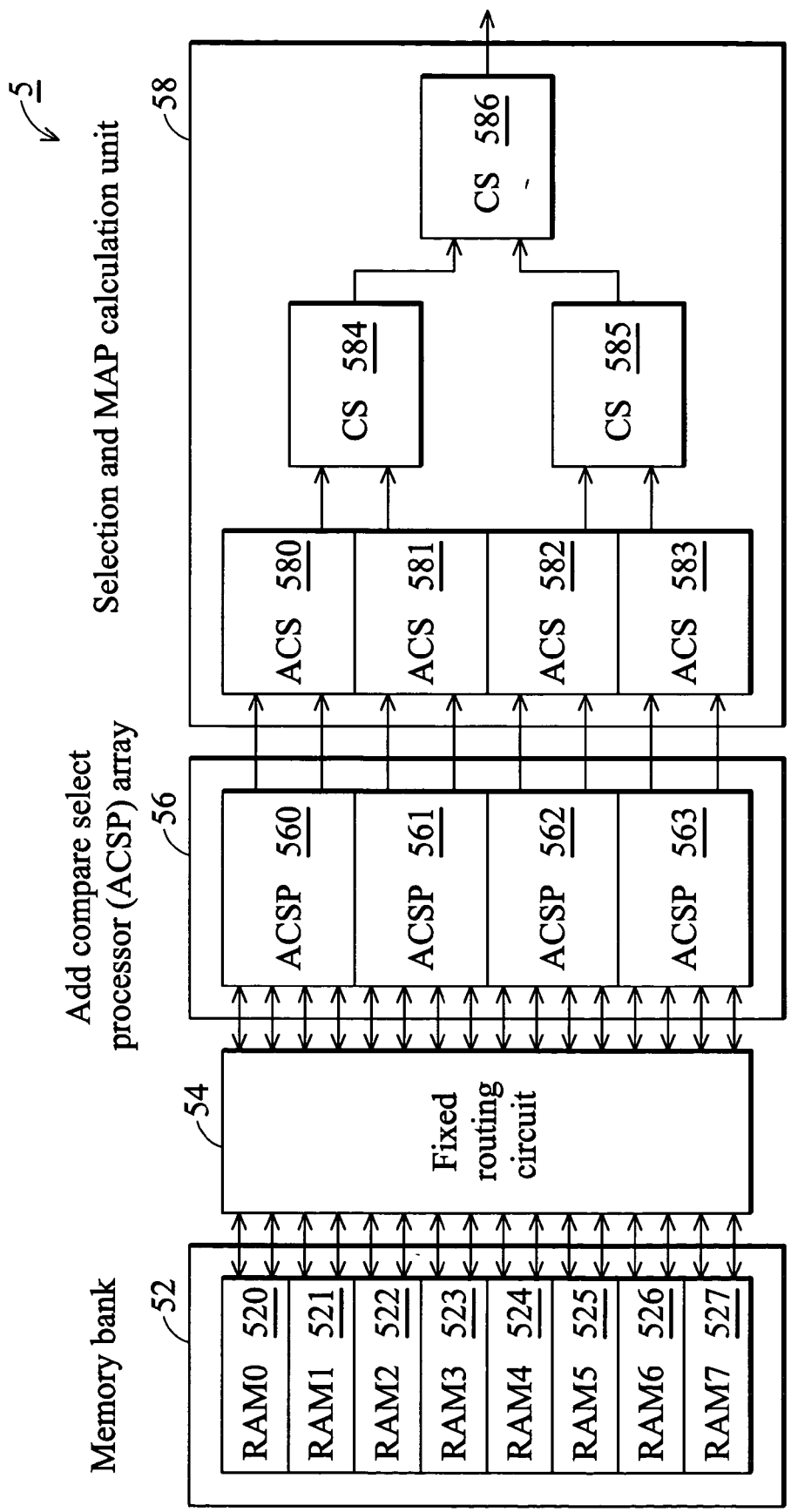
FIG. 5 is a block diagram illustrating an exemplary control circuit in FIG. 4.

FIG. 5 is a block diagram illustrating a control circuit 5, which is an exemplary implementation of the control circuit 42 in FIG. 4 according to the first embodiment. The control circuit 5 comprises memory banks 52, a fixed routing circuit 54, an Add Compare Select Processor (ACSP) Array 56, and a selection and MAP calculation unit 58. There are eight memory banks 520~527 implementing by Random-Access Memory (RAM) coupled to the fixed routing circuit 54. The ACSP array 56 includes four ACSPs 560~563, and each ACSP further includes two Add Compare Select Units (ACSUs). Each ACSP 560~563 corresponds to an Add Compare Select (ACS) unit 580~583 in the selection and MAP calculation unit 58. The outputs of the ACS units 580~583 are provided to Compare Select (CS) units 584~585, and the outputs of the CS units 585~585 are provided to another CS unit 586.

Figure 6A:
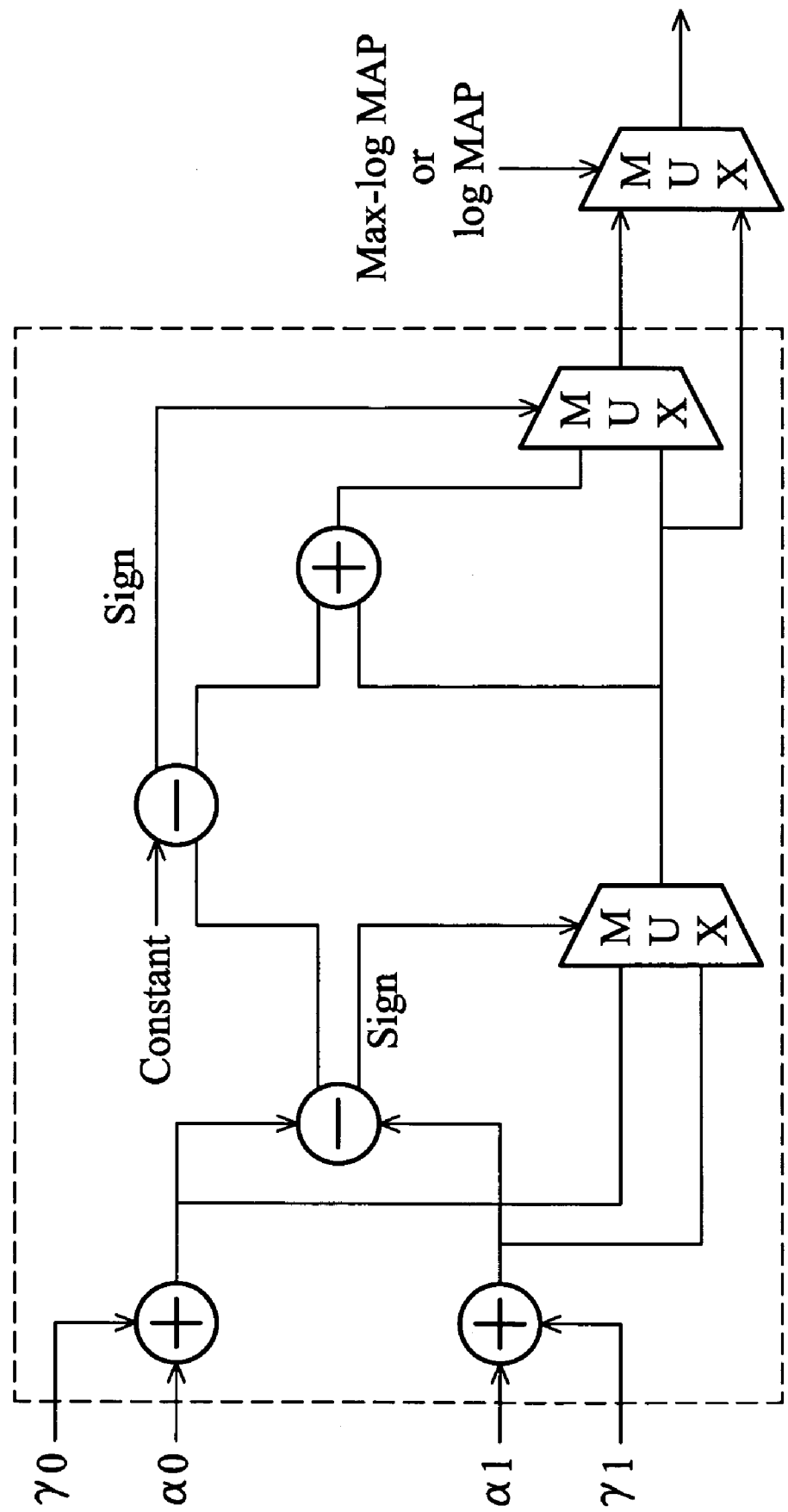
FIG. 6a illustrates the circuitry of an exemplary Add Compare Select Unit (ACSU).
Figure 6B:
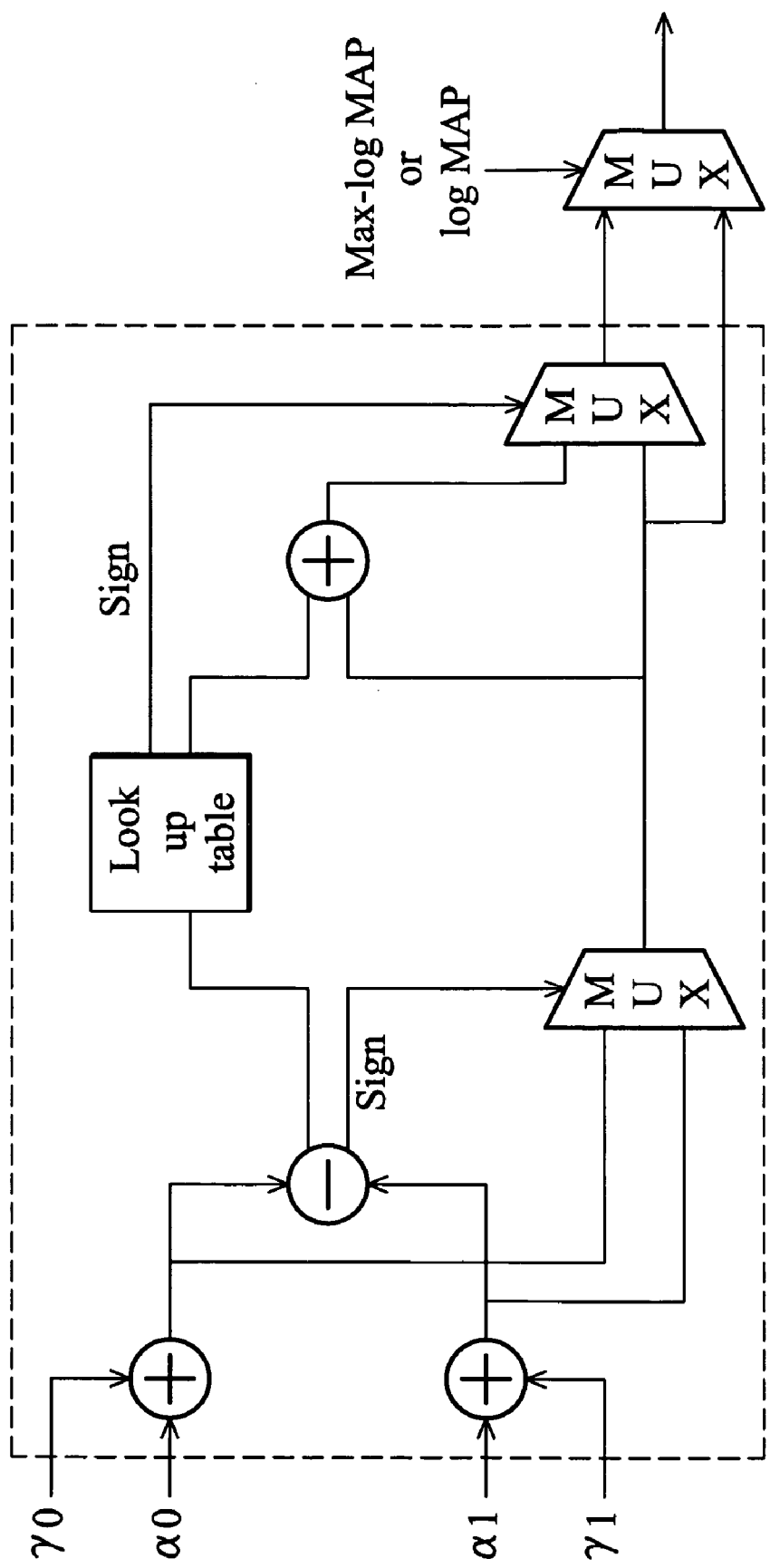
FIG. 6b illustrates the circuitry of another exemplary ACSU.

FIGS. 6a and 6b illustrates two types of Add Compare Select Unit (ACSU) circuitry for the previous described ACSP. The ACSU in FIG. 6a comprises three adders, two comparators, and three multiplexers, whereas the ACSU in FIG. 6b replaces a comparator with a look up table. The connections and relationships of the two ACSUs are identical.

Figure 7A:
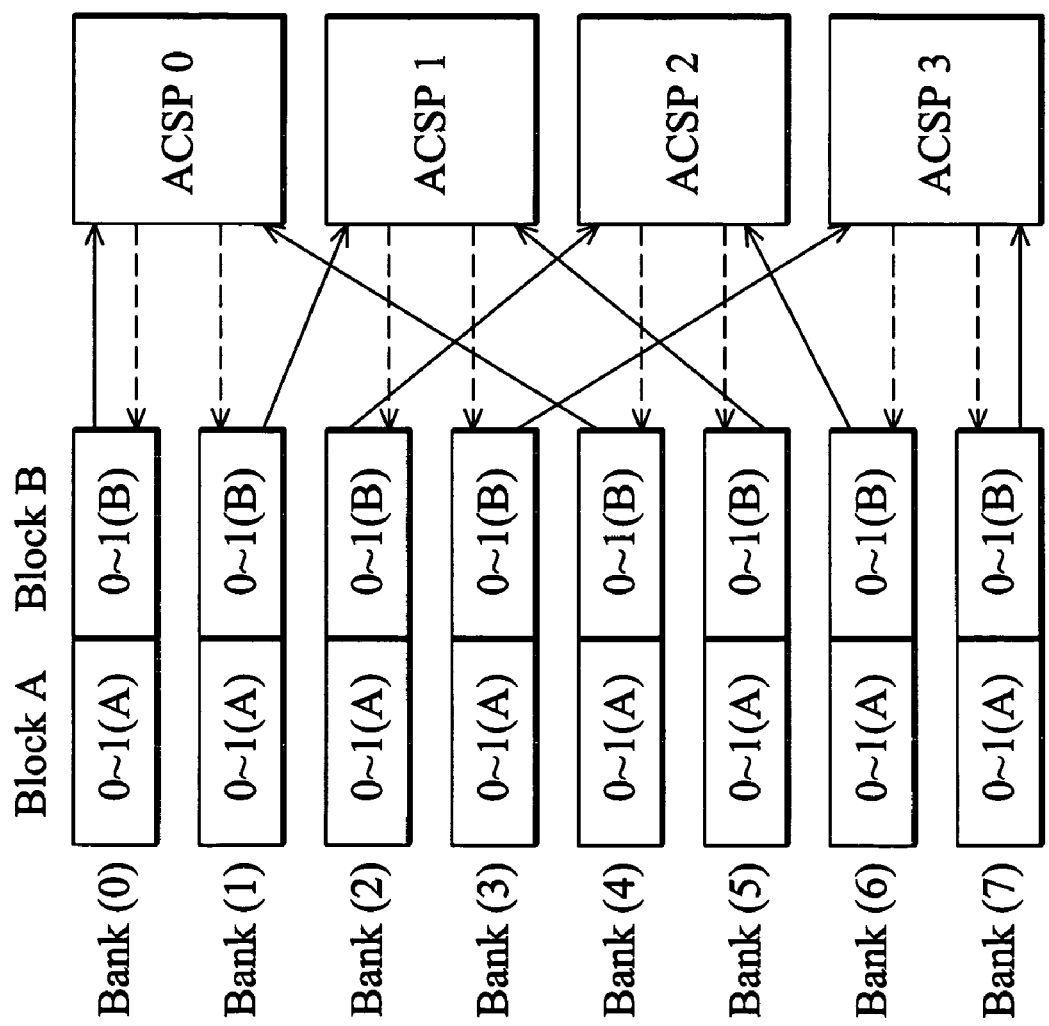
FIG. 7a shows a path metric memory bank organization according to the first embodiment of the invention.

FIG. 7a shows an exemplary path metric memory bank organization illustrating the read/write selection rule defined by the fixed routing circuit 422 of FIG. 4. The memory banks shown in FIG. 5a are physically located in the path metric calculation unit 421 of FIG. 4. The disclosed read/write selection rule in the invention is intended to speed the processing by providing and acquiring path metric information to/from the ACSP array 422 in parallel. The connection lines between the memory bank and the ACSP array 426 are arranged according to the trellis diagram, which cooperates with the ACSP array 423 to process the branch metrics and the partial path metrics simultaneously. Each path metric memory bank (MB) is managed by an address generator (AG).

As shown in FIG. 7a, there are 8 memory banks Bank (0)~Bank(7)) and 4 ACSPs (ACSP0~ACSP3). Each memory bank comprises two blocks (Block A and Block B) for storing path metric information corresponding to two different time points respectively. The read/write memory selection rule for Viterbi decoding is explained using the following example. A first pair of path metric information is stored in Bank (0) of Block A and Bank (4) of Block A respectively at time point $t_1$. ACSP0 obtains the first pair of path metric information for generating two new partial path metrics, and stores the new partial path metrics in Bank (0) of Block B and Bank (1) of Block B at time point $t_{1+p}$, wherein p indicates the processing time for the ACSP to generate new partial path metrics.

Figure 7B:
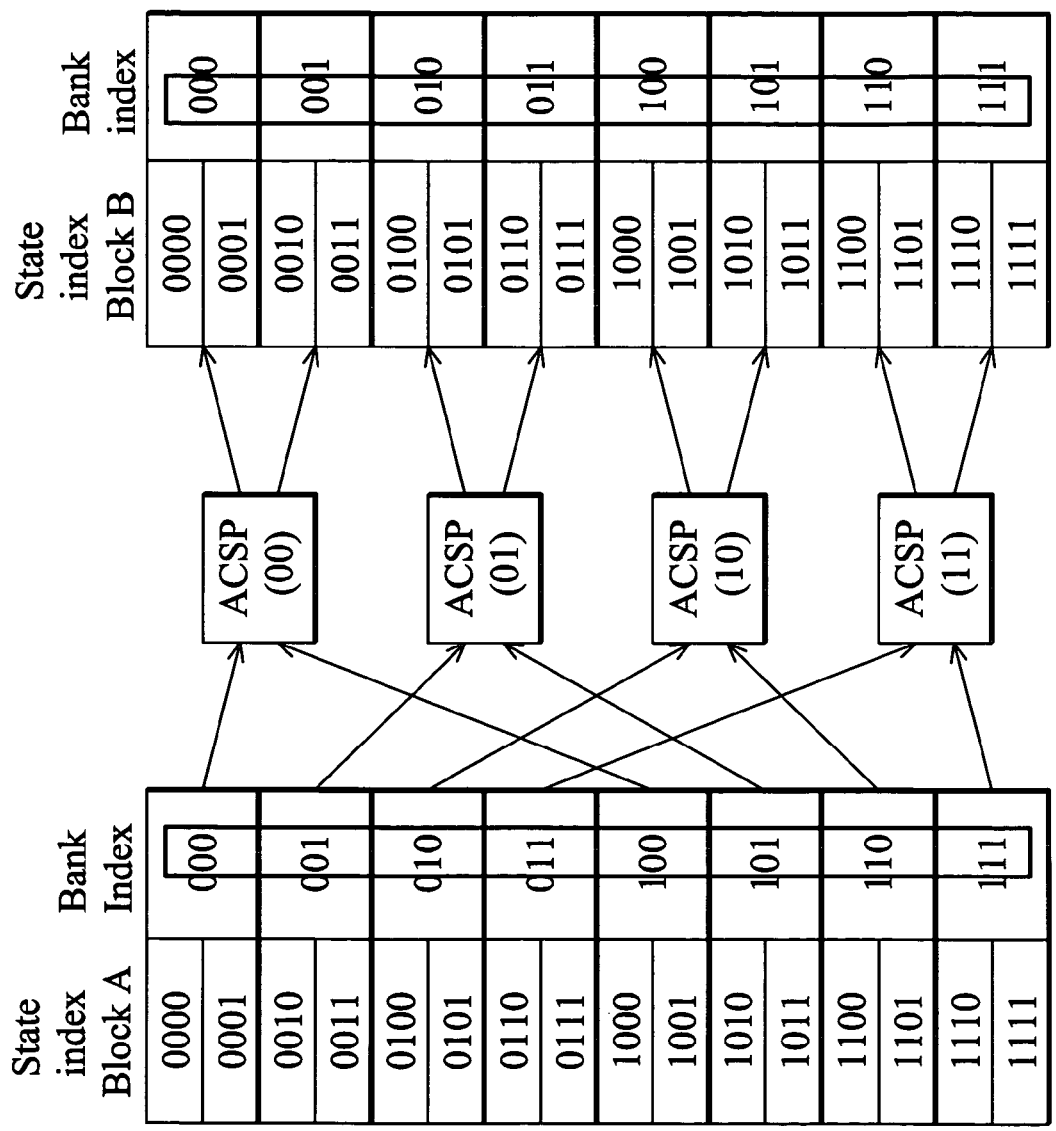

FIG. 7b shows the detail of FIG. 7a, wherein the numbering and index are shown in binary. There are two memory elements in each bank, thus the ACSPs access each bank twice for processing data in both memory elements. For example, ACSP (00) obtains path metric information from a memory element with state index 0000 and a memory element with state index 1000 in Block A at time point $t_1$. Subsequently, ACSP (00) generates two new partial path metrics, and stores these two new partial path metrics in a memory element with state index 0000 and a memory element with state index 0010 in Block B at time point $t_{1+p}$. ACSP (01), ACSP (10), and ACSP (11) interact with the memory banks similarly as ACSP (00) at the same time.

After processing the first memory element of each bank, ACSP (00) obtains path metric information from the memory element with state index 0001 and the memory element with state index 1001 in Block A at time point t2. Similarly, ACSP (00) generates two new partial path metrics and stores them in the memory elements with state index 0001 and state index 0011 in Block B at time point $t_{2+p}$. The remaining ACSPs perform similar read/write procedures as ACSP (00) to process the second memory element of each bank simultaneously.

At the next time point, each ACSP of the ACSP array reads the path metric information from the corresponding banks in Block B for generating new path metric information, and subsequently, storing the new path metric information in Block A. This read/write operation repeats twice, one for the first memory elements and one for the second memory elements of the banks. The ACSPs uses the two blocks (Block A and Block B) iteratively like a double buffer so that the partial path metrics corresponding to the previous node will only get overwrite after obtaining all the partial path metrics of the current node. The path metric information originally stored in Block A will be calculated with a corresponding branch metric and stored in Block B, and subsequently, the path metric information of Block B will be calculated with a corresponding branch metric and stored in Block A, and so on.

The read/write selection rule, also called the routing rule defined by the fixed routing unit for accessing the memory banks is analyzed using the following steps. The number of states is relevant to the constraint length (n+1) of an input symbol for decoding, $2^n$, and a unique state index $S_{n-1} \ldots S_2 S_1 S_0$ is assigned to each state. In the first embodiment, constraint length of the encoder is 5 (n=4), resulting sixteen ($2^n=16$) states. The number of memory banks is $2^{m+1}$, wherein m+1 must be less than or equal to n. In the first embodiment, m is chosen to be 2, so there are eight memory banks. The bank index $S_{n-1}S_{n-2} \ldots S_{n-m-1}$ and the ACSP index $S_{n-2}S_{n-3} \ldots S_{n-m-1}$ are indexes indicating the corresponding memory banks and the ACSP.

In the first embodiment, where n=4 and m=2, the memory element with a state index $S_3S_2S_1S_0$ denotes that it is included in the memory bank with a bank index $S_3S_2S_1$, for example, the memory element with state index 0010 is included in the bank 001. Each ACSP reads two partial path metrics stored in the memory elements with state index $S_3S_2S_1S_0$ according to its ACSP index $S_2S_1$. For example, ACSP 10 reads the partial path metrics stored in the memory elements with state index 0100 or 0101, and state index 1100 or 1101. After the ACSPs generate new partial path metrics, the new partial path metrics will be wrote in the memory elements with state index $S_3S_2S_1S_0$ having the two most significant bits ($S_3S_2$) identical to the ACSP index. For example, ACSP 10 writes the new partial path metrics in the memory elements with state index 1000 or 1001, and state index 1010 or 1011.

Figure 8:
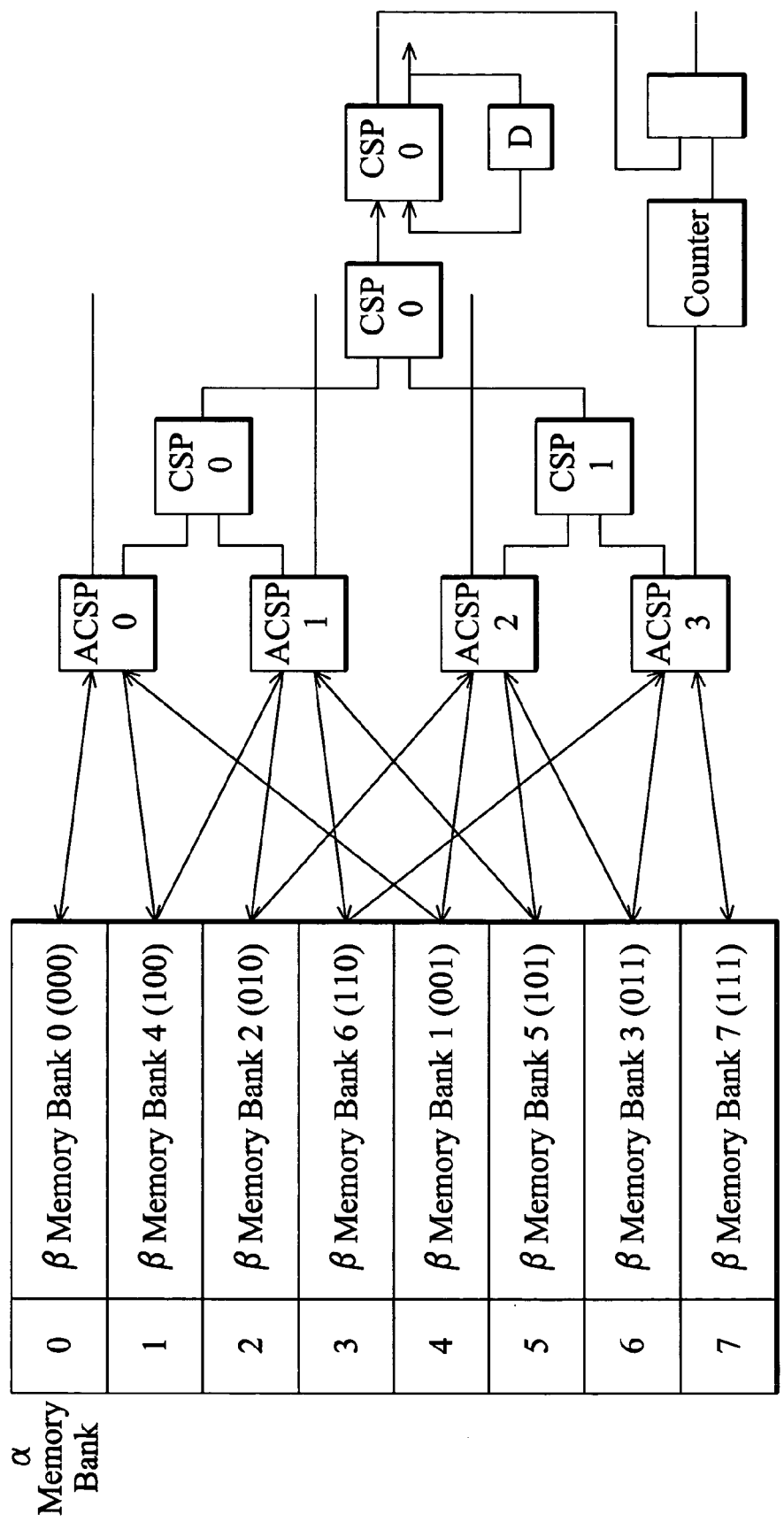
FIG. 8 illustrates a path memory access rule for Turbo decoding according to the first embodiment of the invention.

FIG. 8 shows a diagram of path metric memory access for Turbo decoding according to the first embodiment of the invention. The routing rule for Turbo decoding is almost the same as Viterbi decoding, thus they can share the fixed routing unit, the ACSP array, and the memory banks stored in the path metric calculation unit. For Turbo decoding, it is necessary to perform bit reversion for the state index, which means that the memory element with state index 001 becomes 100, and the memory element with state index 011 becomes 110. As shown in FIG. 8, the read/write connections between the memory banks and the ACSPs are identical to the previously described Viterbi decoding, the state indexes (not shown) and the corresponding bank indexes are however been reversed.

As shown in FIG. 4, the BMC unit 41 computes the branch metric y, whereas the path metric calculation unit 421 stores the forward path metric α and the backward path metric β computed by the ACSP array 423. The three metrics α, β and γ are used in the selection and MAP calculation unit 424 for obtaining a log-likelihood ratio (LLR) as shown in the following.

$$\Delta(c_t) = \log \frac{\sum_{l=0}^{M_s-1} \alpha_{t-1}(l') \gamma_t^1(l', l) \beta_t(l)}{\sum_{l=0}^{M_s-1} \alpha_{t-1}(l') \gamma_t^0(l', l) \beta_t(l)}$$

Turbo decoding in the first embodiment of the invention utilizes the MAP decoding algorithm to calculate the LLR at each time point according to the branch metric γ, forward path metric α, and backward path metric β.

Second Embodiment

Figure 9:
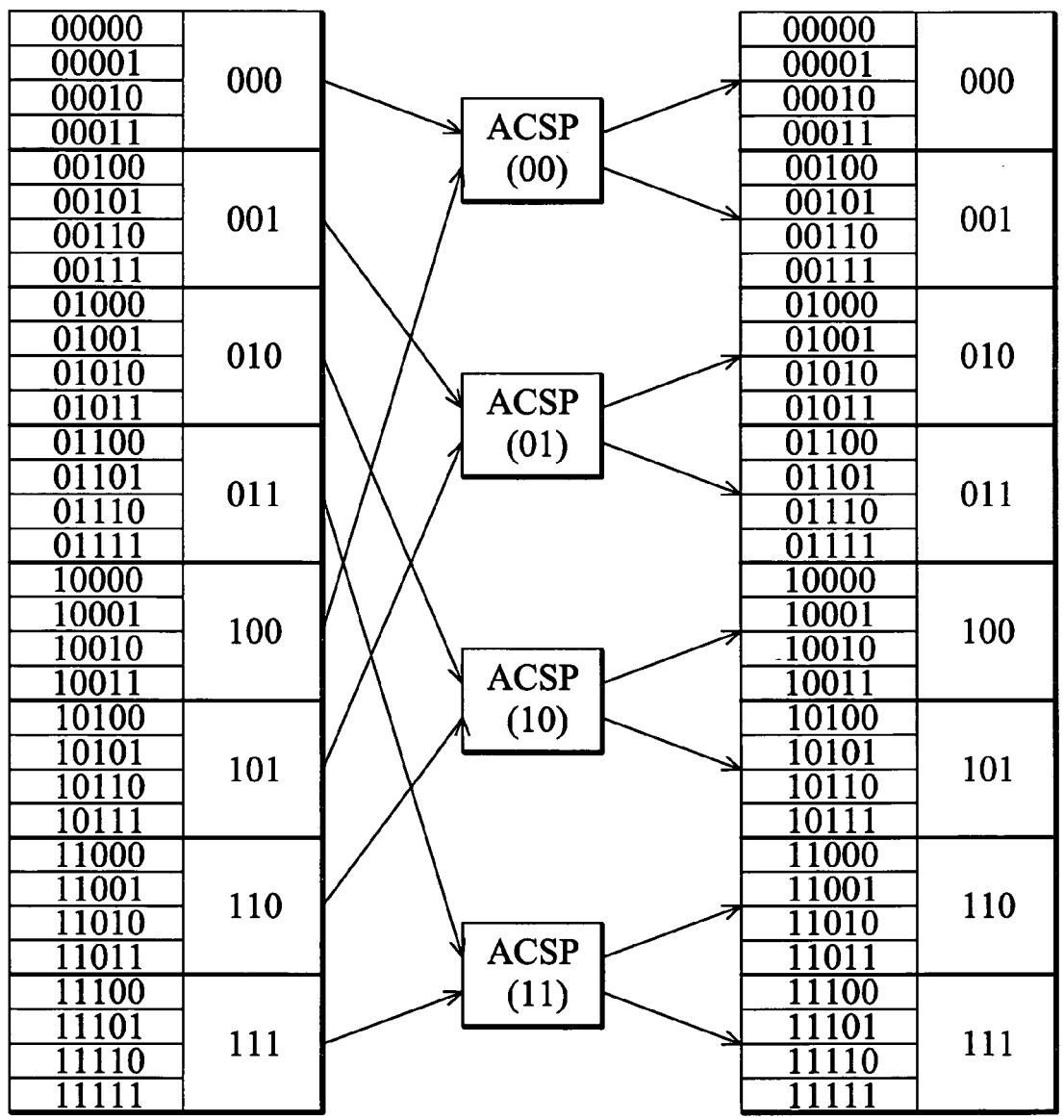
FIG. 9 illustrates a path metric memory bank organization according to the second embodiment of the invention.

FIG. 9 illustrates the path metric memory access according to the second embodiment of the invention. In the second embodiment, constraint length of the encoder is 6 (n=5), thus there are thirty-two ($2^5$) states for Viterbi decoding. Four ACSPs ($2^m$, m≤4, choose m=2) and eight memory banks ($2^{m+1}$) are chosen in the second embodiment. Since there are four memory elements in each memory bank, and each ACSP can only access one memory bank during one cycle, each ACSP needs to read the partial path metrics from the two corresponding memory banks in a first memory block four times, one for each memory element, and similarly, write the newly generated partial path metrics in the two corresponding memory banks in the second memory block four times. The routing rule for reading and writing the memory banks is identical as the first embodiment.

Third Embodiment

Figure 10A:
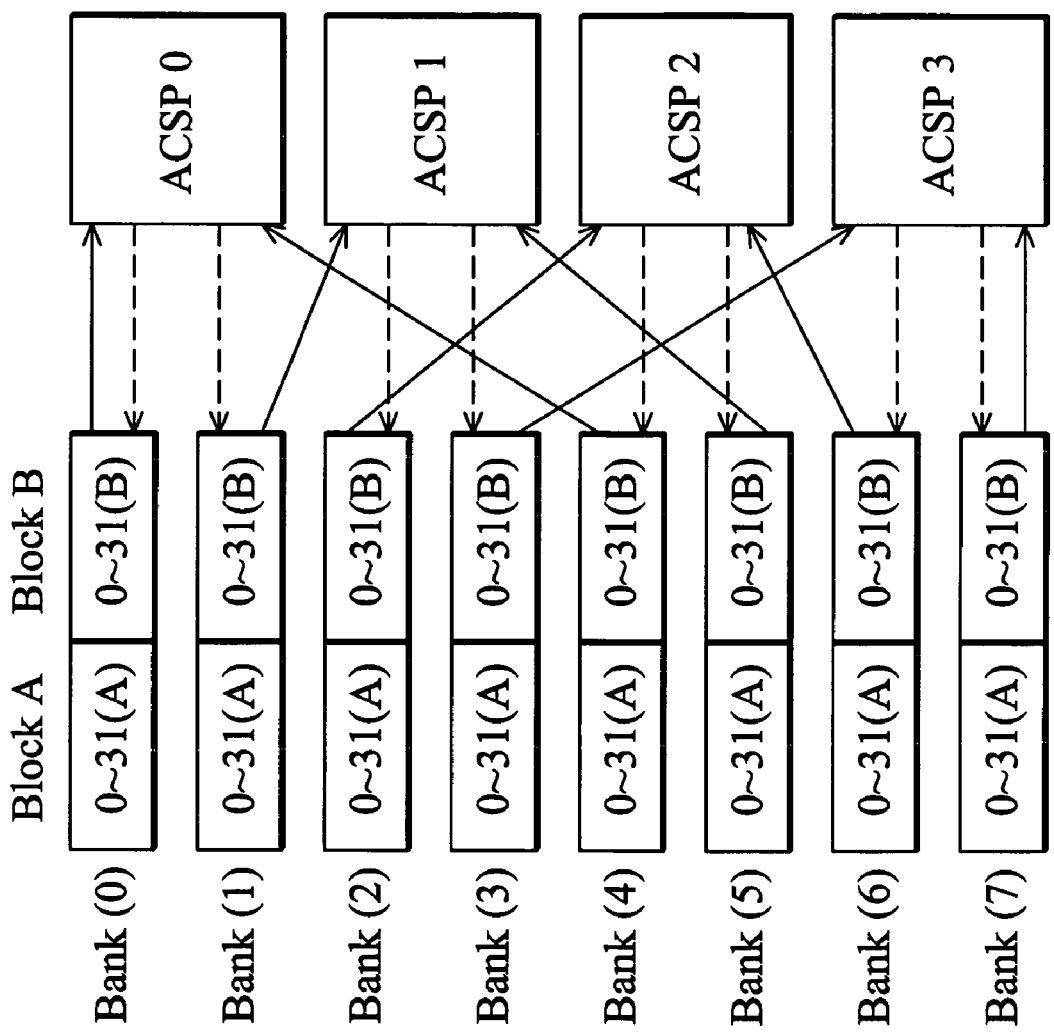
FIG. 10a shows a path metric memory bank organization for 256 states Viterbi decoding according to the third embodiment of the invention.

FIGS. 10a and 10b illustrate the path metric memory bank organization and the data structure corresponding to the path metric memory bank for 256-state Viterbi decoding according to the third embodiment of the invention. In the third embodiment, constraint length of the encoder is 9, and again, four ACSPs and eight memory banks are used. Every path metric memory bank has two memory blocks (Block A and Block B), and the block index for Block A and Block B are 0 and 1 respectively. The four ACSPs processes eight states during each cycle, thus for decoding a Viterbi code word with 256 states per code word, the ACSPs spend 32 cycles (256/8 =32) for reading and writing partial path metrics of a node from/in the memory banks.

Figure 11:
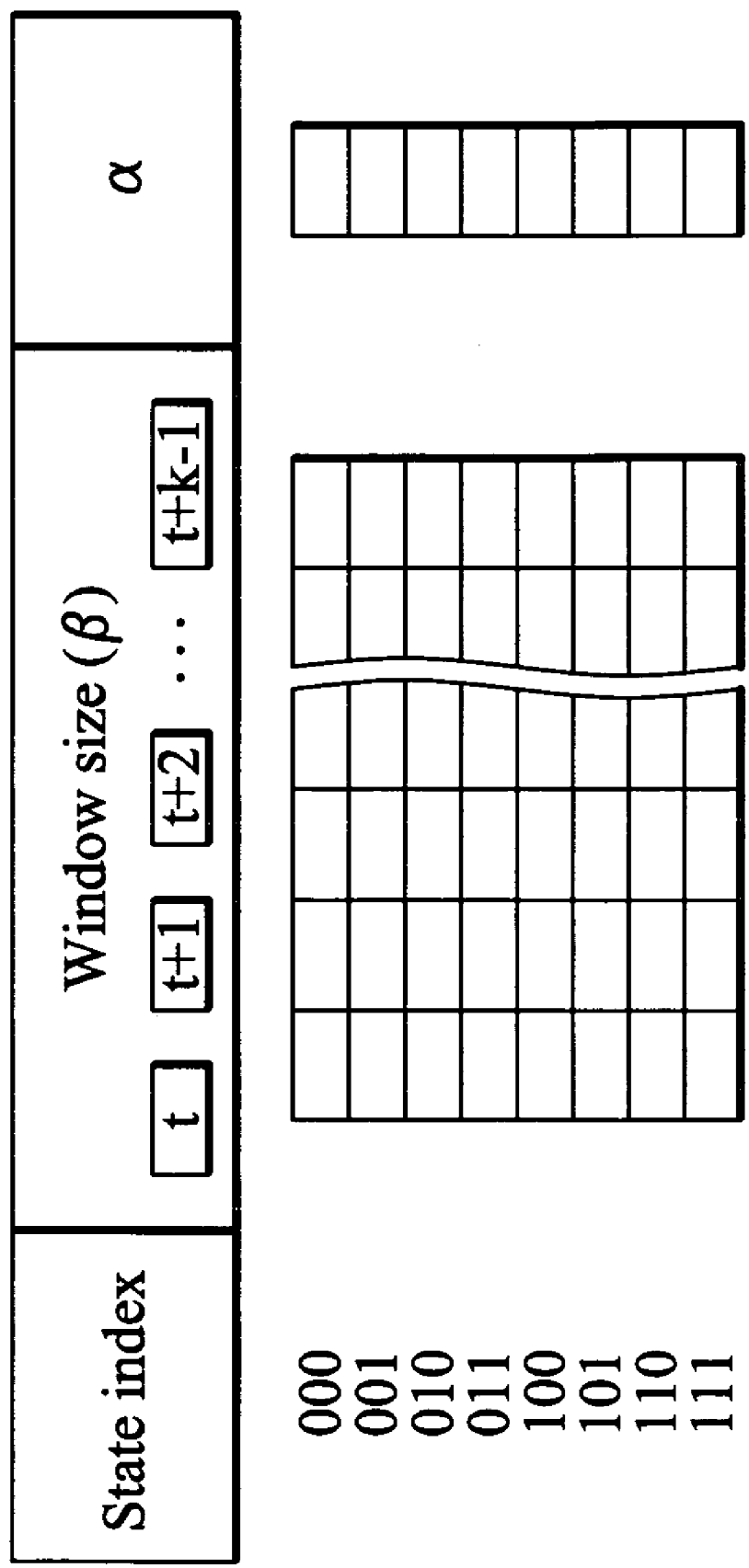
FIG. 11 shows the data structure in the path metric memory bank for Turbo decoding according to the third embodiment of the invention.

The same hardware (i.e. ACSPs and memory banks) for 256-state Viterbi decoding is appropriate for 8-state Turbo decoding in terms of processing speed and memory size. For Turbo decoding, constraint length of each encoder is 4(n=3), causing eight possible states. FIG. 11 shows the data structure in the path metric memory bank for Turbo decoding according to the third embodiment of the invention. The state index for Turbo decoding is different from Viterbi decoding as it requires bit reversion. The window size in the third embodiment is set to be thirty-two (k=32), and such Turbo decoding decodes a Turbo code word according to thirty-two entries of backward path metric β. In every cycle, the ACSPs process eight states to obtain a backward path metric β and stored in the memory bank according to time sequence t, t+1, t+k−1. In k cycles (k=32 in this embodiment), the ACSPs process 8k (8×32=256) states, and a total of k entries of backward path metrics β and one entry of forward path metric α are generated and stored in the memory bank.

The selection and MAP calculation unit 424 in FIG. 4 obtains the branch metric γ from the BMC unit 41, as well as the thirty-two backward path metrics β and one forward path metric α from the memory banks stored in the path metric calculation unit 421, and calculates a log-likelihood ratio (LLR) based on these metrics. The result of the selection and MAP calculation unit is outputted to the interleaver/de-interleaver 44 to generate the result for Turbo decoding.

Figure 12:
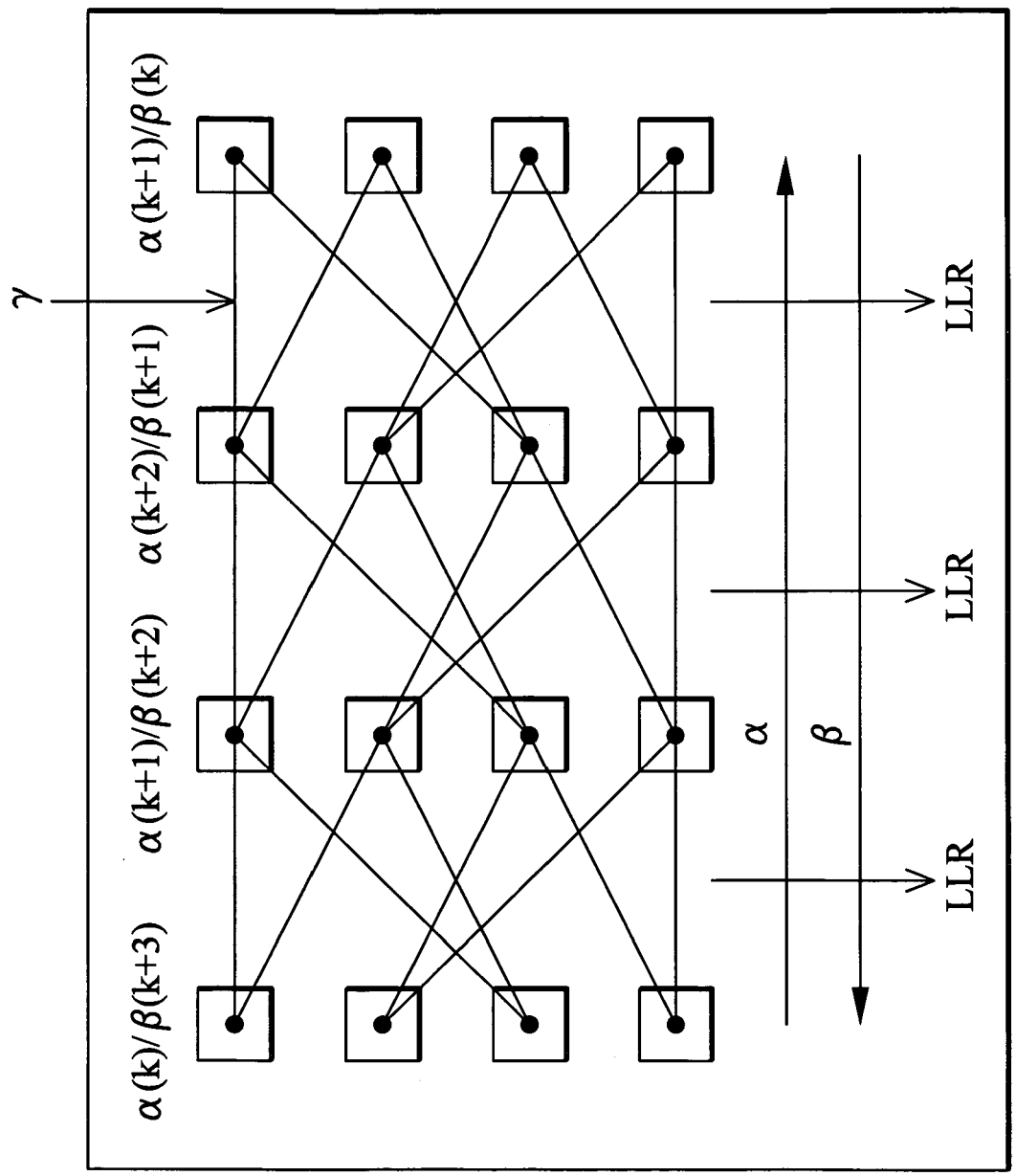
FIG. 12 illustrates the MAP decoding algorithm employed in Turbo decoding.

FIG. 12 illustrates the MAP decoding algorithm used in Turbo decoding. There are only four stages of four states are shown in FIG. 10. A backward path metric β is calculated at each stage, but the forward path metric α is only calculated once per code word. The LLR indicates the log of a ratio between probability of one P(1) and probability of zero P(0).

The Viterbi/Turbo unified decoder of the invention is configurable depending on the type of receiving data, and the control circuit is designed to be capable of storing and computing partial path metrics for both Viterbi and Turbo decoding. The routing rule for the ACSP array to access the memory banks is fixed for both decoding types. In an embodiment, the memory banks for storing the partial path metrics are efficiently used in both Viterbi and Turbo decoding. For example, if the decoder is designed to receive either a 256-state Viterbi code word or an 8-state Turbo code word, the window size for Turbo decoding is chosen to be 32 (256/8). The memory banks store eight states of backward path metrics corresponding to 32 time points (stages) when decoding an 8-state Turbo code word, whereas for decoding an 256-state Viterbi code word, the ACSP array processes 8 states during one cycle, thus requires 32 cycles. The memory size and the processing time for the two decoding are therefore approximately the same. In another embodiment, a plurality of Viterbi/Turbo unified decoder of the invention are employed for decoding a bunch of data streams comprising Turbo symbols or/and Viterbi symbols, each decoder is capable of decoding any type of input. The decoding time for each decoder is designed to be approximately the same regardless the decoding scheme. An advantage of such design is to reduce the number of decoder required since each decoder can be used to decode both Viterbi and Turbo code words. Another advantage is that all the decoders can finish the decoding process at approximately the same time, so that the decoders can work in parallel without waiting for the processing delay of certain decoders.

Finally, while the invention has been described by way of example and in terms of the above, it is to be understood that the invention is not limited to the disclosed embodiment. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A Viterbi/Turbo unified decoder for decoding a Viterbi or Turbo code word, the decoder comprising:

a Branch Metric Calculation (BMC) unit, receiving input symbols and determining a branch metric associated with each node of the code word;

a control circuit, computing partial path metrics at each node according to the corresponding branch metric received from the BMC unit and the partial path metrics at a preceding node stored in a first memory block, storing the computed partial path metrics in a second memory block, wherein the order and address for reading and writing the partial path metrics from/to the memory blocks follow a fixed routing rule for parallel processing, and performing either selection or Maximum a Posteriori probability (MAP) calculation depending on the code word type to identify a surviving path at each node;

a trace-back unit, coupled to the control circuit for generating decoded output for the Viterbi code word by tracking the surviving paths designated by the control circuit;

an interleaver/de-interleaver, coupled to the control circuit for generating decoded output for the Turbo code word by permuting or recovering the ordering of the input in a deterministic manner; and a Turbo buffer, receiving the input symbols and the output of the interleaver/de-interleaver, and providing storage for the BMC unit and the interleaver/de-interleaver.

2. The Viterbi/Turbo unified decoder according to claim 1, wherein the control circuit comprises:

an Add Compare Select Processor (ACSP) array comprises J ACSPs for computing the partial path metrics at each node according to the corresponding branch metric, wherein each ACSP comprises two Add Compare Select units (ACSU) processing the partial path metrics in parallel, and J=2m, m is an integer;

a path metric calculation unit comprises the first and second memory blocks for storing the partial path metrics of a current node and a preceding node respectively, wherein each memory block comprises l memory banks, wherein l=2m+1, a fixed routing circuit, coupled to the ACSP array and the path metric calculation unit for establishing fixed connections between each ACSP and four memory banks, two from each memory block, according to the fixed routing rule; and a selection and MAP calculation unit, performing either selection or MAP calculation to identify the surviving path at each node.

3. The Viterbi/Turbo unified decoder according to claim 2, wherein m+1 must be less than the constraint length of the encoder.

4. The Viterbi/Turbo unified decoder according to claim 2, wherein the first and second memory blocks are equal in size, and each memory bank comprises equal number of memory element for storing the partial path metrics.

5. The Viterbi/Turbo unified decoder according to claim 2, wherein the selection and MAP calculation unit computes a Log-Likelihood Ratio (LLR) according to the branch metrics obtained from the BMC unit and the partial path metrics obtained from the path metric calculation mean for the Turbo code word.

6. The Viterbi/Turbo unified decoder according to claim 5, wherein $$\Delta(c_t) = \log \frac{\sum_{l=0}^{M_s-1} \alpha_{t-1}(l')\gamma_t^1(l',l)\beta_t(l)}{\sum_{l=0}^{M_s-1} \alpha_{t-1}(l')\gamma_t^0(l',l)\beta_t(l)}$$

the LLR ratio estimating a probability for tracing the survival path, wherein $\alpha$ terms denote forward recursion, $\beta$ terms denote backward recursion, and $\gamma$ terms denote branch probability.

7. The Viterbi/Turbo unified decoder according to claim 2, wherein the path metric calculation unit stores a forward path metric $\alpha$, and K backward path metrics $\beta$ for each state of the Turbo code word, and K is the window size for Turbo decoding.

8. The Viterbi/Turbo unified decoder according to claim 7, wherein m=2, K=32, and the decoder is capable of decoding 256-state Viterbi and 8-state Turbo encoding.

9. The Viterbi/Turbo unified decoder according to claim 1, wherein the branch metric associated with each node is a squared distance between the received symbols and the decoded output at the associated node.

10. The Viterbi/Turbo unified decoder according to claim 1, further comprising a last-in-first-out (LIFO) buffer coupled to the trace-back unit for outputting the decoded Viterbi output.

11. The Viterbi/Turbo unified decoder according to claim 1, further comprising a surviving path updating unit coupled to the control circuit and the trace-back unit for storing the most recent computed surviving paths.

12. The Viterbi/Turbo unified decoder according to claim 1, wherein the Turbo buffer comprises an input buffer and an interleaver/de-interleaver buffer, the input buffer stores the received symbols and the interleaver/de-interleaver buffer stores the output of the interleaver/de-interleaver.

* * * * *